US 6,619,836 B1

(12) United States Patent
Silvant et al.

(10) Patent No.: US 6,619,836 B1
(45) Date of Patent: Sep. 16, 2003

(54) ELECTRONIC WRISTWATCH INCLUDING A PRINTED CIRCUIT INCORPORATED IN A FLEXIBLE WRISTBAND

(75) Inventors: Olivier Silvant, Macolin (CH); Jacques Müller, Reconvilier (CH)

(73) Assignee: The Swatch Group Management Services AG (CH)

( * ) Notice: Subject to any disclaimer, the term of this patent is extended or adjusted under 35 U.S.C. 154(b) by 0 days.

(21) Appl. No.: 09/869,971

(22) PCT Filed: Nov. 13, 2000

(86) PCT No.: PCT/CH00/00604

§ 371 (c)(1),
(2), (4) Date: Jul. 10, 2001

(87) PCT Pub. No.: WO01/35173

PCT Pub. Date: May 17, 2001

(30) Foreign Application Priority Data

Nov. 11, 1999 (CH) ................................................ 2061/99

(51) Int. Cl.[7] .............................. A44C 5/00; G04B 37/00
(52) U.S. Cl. ........................................ 368/281; 368/282
(58) Field of Search ................................ 368/281, 282; 224/164–180

(56) References Cited

U.S. PATENT DOCUMENTS

| 4,130,987 A | * | 12/1978 | Schickedanz | ................ | 368/29 |
| 4,255,801 A | | 3/1981 | Ode et al. | | |
| 4,412,751 A | | 11/1983 | Jeannet et al. | | |
| 4,421,423 A | * | 12/1983 | Lederrey | ................ | 368/291 |
| 4,779,249 A | * | 10/1988 | Rappaport | ................ | 368/276 |
| 5,012,229 A | * | 4/1991 | Lennon et al. | ................ | 345/1.1 |
| 5,020,039 A | * | 5/1991 | Yokote | ................ | 368/282 |
| 6,216,490 B1 | * | 4/2001 | Radley-Smith | ................ | 63/3 |

FOREIGN PATENT DOCUMENTS

| DE | 87 03 843 U | | 4/1987 | | |
| FR | 2 240 475 A | | 3/1975 | | |
| FR | 2 595 480 | | 9/1987 | | |
| FR | 2599867 A1 | * | 12/1987 | ................ | 224/168 |
| GB | 2 148 617 A | | 5/1985 | | |
| GB | 2 201 266 A | | 8/1988 | | |

* cited by examiner

Primary Examiner—David Martin
Assistant Examiner—Michael L. Lindinger
(74) Attorney, Agent, or Firm—Griffin & Szipl, P.C.

(57) ABSTRACT

The electronic watch movement components (11, 12) of the watch are mounted on a flexible printed circuit film (10), which is then incorporated in the wristband (1) by overmoulding of an insulating elastomeric material. External elements in the form of cases (2–4) are mounted in a sealed manner on the wristband to protect said components and to cover at least a display unit (20) and an electric power source (15). Decorative elements (5) similar to the cases are distributed along the wristband to imitate links. Such a wristwatch may be manufactured at a low cost.

18 Claims, 3 Drawing Sheets

Figure 1:
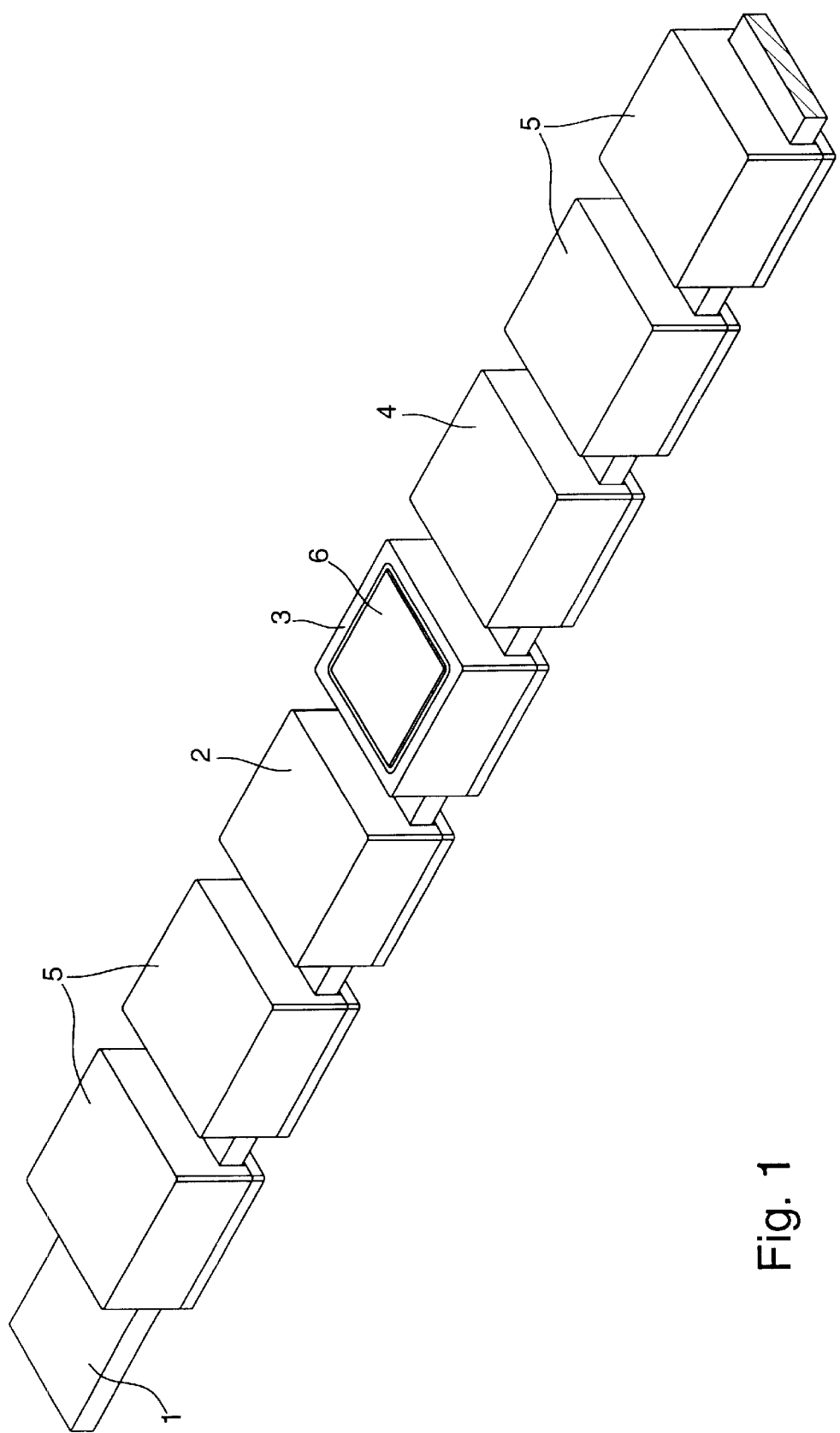

ELECTRONIC WRISTWATCH INCLUDING A PRINTED CIRCUIT INCORPORATED IN A FLEXIBLE WRISTBAND

The present invention concerns an electronic wristwatch including a flexible wristband having a body made of moulded elastomer, an electronic watch movement including components mounted on a flexible printed circuit film, said components and said flexible film being incorporated in the body of the wristband by overmoulding of the elastomer of said body, a display unit controlled by the watch movement, and an electric power source connected to the watch movement. The invention also concerns a method for manufacturing such a wristwatch.

French Patent Application No. 2 595 480 provides a wristwatch of this type, including a liquid crystal or similar display unit, controlled by an electronic circuit powered by a battery or another electric power source. The constituent elements of the electronic circuit and the display unit itself are incorporated in the wristband, which is manufactured in a flexible plastic material or similar by overmoulding these elements in the form of a flat strip of small thickness, the display screen being located in the median part of the wristband. The battery housing is arranged in a thicker part located at one of the ends of the wristband, which can carry a fastening element for the latter. In proximity to the display screen several touch sensitive control buttons are provided which are integrated inside the wristband, but whose upper surface is flush with the corresponding surface of the wristband. Since the display screen is integrated in the wristband owing to the duplicate moulding thereof, the upper surface of the screen must be flush with the upper surface of the wristband so that the indications displayed are visible, unless the wristband is moulded in a transparent plastic material allowing the display to be read.

With such a structure, it will be understood that the plastic material used for the overmoulding has to be relatively soft for the wristband to be sufficiently flexible. Consequently, the components embedded in this material are not well protected against external pressure and are liable to become damaged quickly when the watch is worn on the wrist. This may explain the fact that this type of watch has not met with commercial success to date.

British Patent Application No. 1 574 730 discloses a wristwatch whose case and wristband are formed of a single moulded part, for example made of polypropylene, this wristband being connected to the case by thinned parts which form flexible hinges. The wristband includes housings fitted with control buttons which are electrically connected to the electronic modules mounted in the case by a printed circuit film, which is embedded in the plastic material. The manufacture of such a watch is relatively complex because it requires multiple elements to be mounted in the case and the housings provided in the wristband.

The object of the present invention is to create a wristwatch wherein most or all of the electronic components are embedded in a flexible wristband, but are nonetheless sheltered from damage which could be caused by external influences during normal use of the watch. Furthermore, this watch should be able to be manufactured at a very low cost.

The invention thus concerns an electronic wristwatch of the type indicated in the preamble, characterised in that it includes a plurality of external elements mounted on the body of the wristband and connected to each other in a flexible way by the wristband, at least certain of these external elements being cases arranged so as to cover and protect watch movement components and the display unit.

Thus, the fragile elements of the watch, namely the watch movement components and the display unit, are mounted economically in or on the wristband and are protected by sufficiently rigid cases, which may be extremely simple and inexpensive while having an attractive external appearance. The wristwatch may be completed by other external elements, for example decorative elements having a similar appearance to that of the cases and distributed along the body of the wristband.

The invention also provides an advantageous method for manufacturing such a wristwatch, including the following steps: the watch movement components are mounted on the flexible printed circuit film, which includes electric connection means for connecting it to the display unit and the power source; then the body of the wristband is made by overmoulding over the flexible film and said components, with the exception of the connection means; then the display unit and the power source are connected to said connection means and the external elements are fixed to the body of the wristband.

Figure 2:
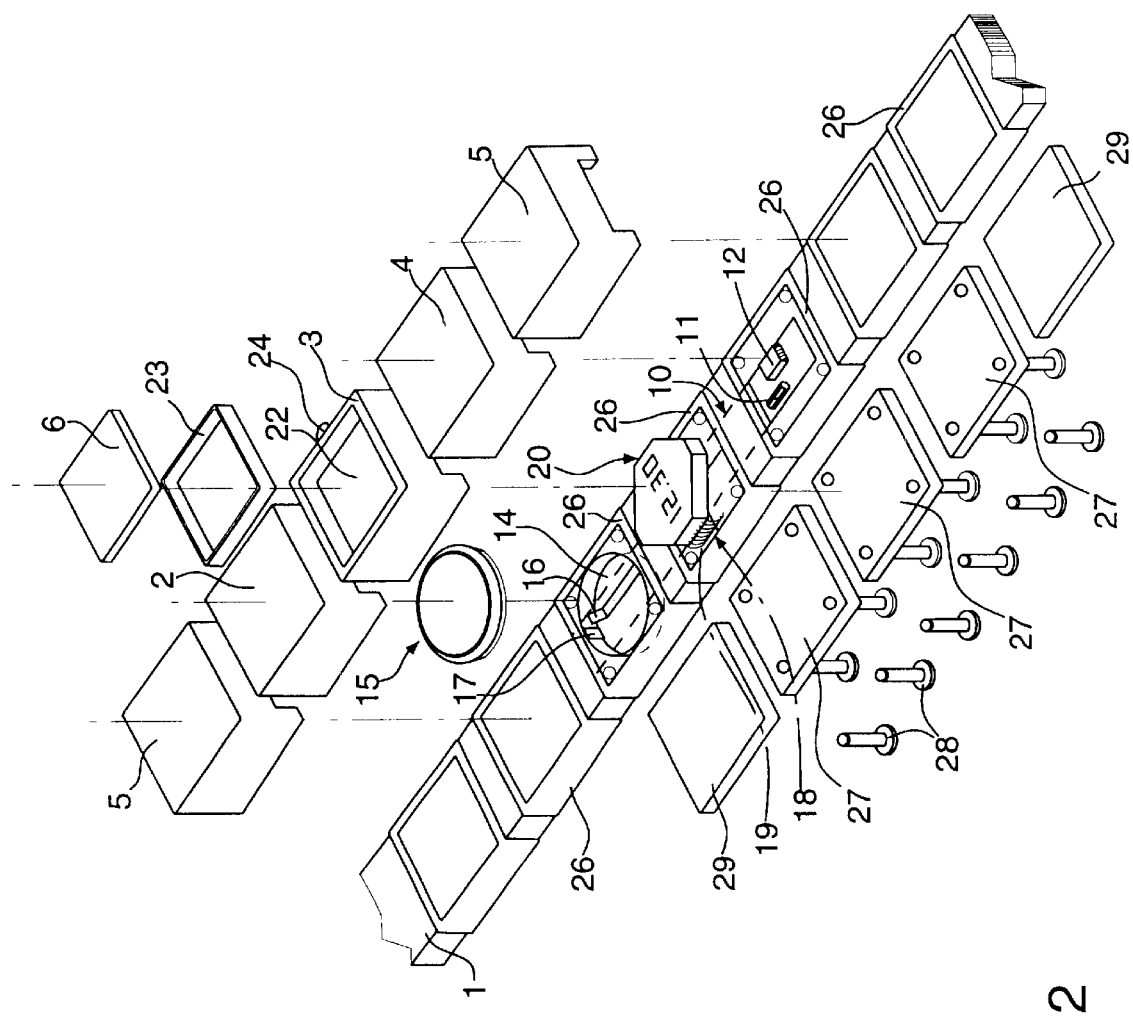
Figure 3:
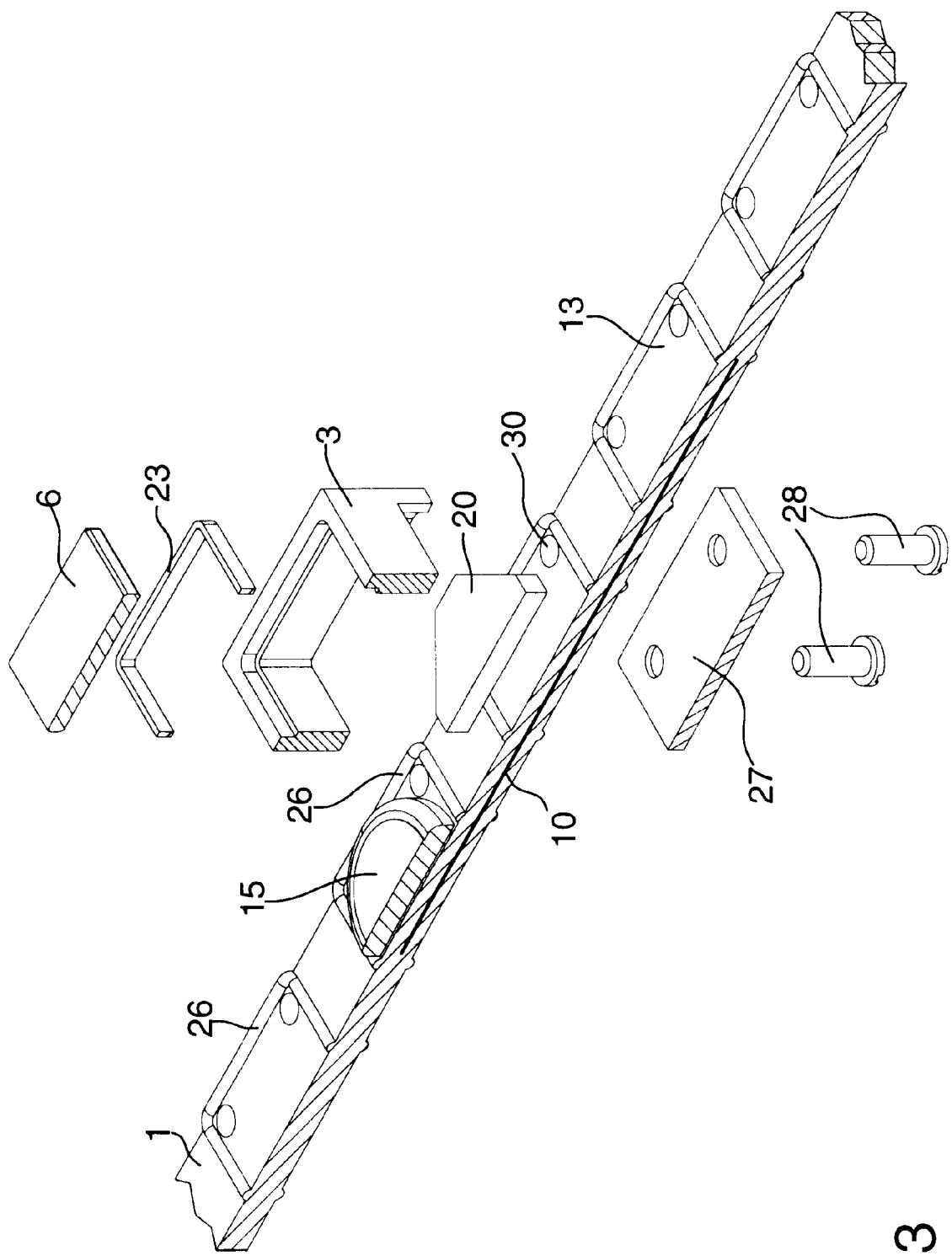

Other features and advantages of the invention will appear in the following description of a preferred embodiment, given by way of non limiting example with reference to the annexed drawings, in which:

FIG. 1 is a partial perspective view of a wristwatch according to the present invention, FIG. 2 is an exploded perspective view showing the main elements of the watch of FIG. 1, and FIG. 3 is a perspective longitudinal cross-section showing certain elements of the FIG. 2.

The wristwatch shown in FIG. 1 includes a flexible wristband 1 on which is mounted a row of external elements including cases 2, 3, 4 and decorative elements 5. These external elements are distributed along flexible wristband 1 which connects them to each other and which includes at its ends conventional fastening means which are not shown, for example a buckle with a tongue or a folding clasp. External elements 2 to 5 have preferably all the same size and may be shaped to give the wristband the appearance of a bracelet with links or another fanciful look. In this example, unlike a conventional watch, one cannot see a case containing all the watch movement and the display, but only a crystal 6 disposed on the upper surface of case 3 to allow a display unit contained in the case to be read.

The inner structure of the wristwatch appears in FIGS. 2 and 3. The body of wristband 1 is formed by a strip moulded in an electrically insulating thermoplastic, such as an elastomer and contains a flexible printed circuit film 10 which, in the present example, extends into the zone covered by the three cases 2, 3 and 4, in particular to electrically connect the watch elements which are covered by these cases. Most and preferably all the watch movement components are mounted on film 10, of which for example a quartz resonator 11 and an integrated circuit 12 can be seen in FIG. 2, in the zone covered by case 4. It will be noted that in this zone the upper part of the elastomer, indicated by the reference 13 in FIG. 3, has been omitted in FIG. 2 so as to show components 11 and 12, but in reality they are embedded in the elastomer.

In the zone covered by case 2, a cavity 14 is arranged in the upper part of the elastomer wristband to accommodate the lower part of an electric battery 15 acting as the electric power source for the watch. Flexible printed circuit film 10 includes in this zone two contact strips 16 and 17 which emerge into cavity 14 to abut against the corresponding poles of battery 15 and connect the latter to the printed circuits.

In the zone covered by case 3, flexible film 10 includes a connection tongue 18 provided with conductive paths 19 to connect the printed circuits to a display unit 20, preferably formed by a liquid crystal display cell. Since unit 20 is not incorporated in the elastomer of wristband 1, connection tongue 18 emerges from the elastomer and it is preferably bent to be secured to the edge of unit 20 bearing the cell control contacts, for example by means of an anisotropic adhesive material. In the example shown, tongue 18 extends laterally from flexible film 10, but it could also extend longitudinally.

While cases 2 and 4 are completely closed at the top and on the sides, central case 3 has an upper opening 22 in which crystal 6 is mounted using a sealing gasket 23. Moreover, case 3 or one of the two other cases 2 and 4 is fitted with a push-button 24 controlling various watch functions, in particular time-setting, via paths 19 of tongue 18.

Cases 2, 3 and 4 are open towards the bottom and shaped to overlap the body of wristband 1, against which they abut in a sealed manner owing to the fact that the compressible nature of the elastomer allows it to act as a sealing gasket. In order to increase locally this compressibility, the body of the wristband has a superficial rim 26 on its upper surface and its lateral surfaces, facing the surfaces of cases 2 to 4 and abutting against the wristband. Each of cases 2 to 4 is secured to wristband 1 via a respective bottom plate 27 provided with holes through which pass screws 28, which also pass through holes 30 of the wristband and engage in the lateral walls of the case. This allows the body of wristband 1 to be gripped between the plate and the case to guarantee sealing.

Decorative elements 5 overlap the body of wristband 1 like cases 2 to 4 and are also secured by being gripped onto the latter via a respective bottom plate 29. Since there is no concern as to sealing in this case, plate 29 does not have to be secured to decorative element 5 by screws and may also be secured, for example, by bonding or snap fitting. The decorative elements may also have an annular shape and be slipped onto the body of wristband 1.

Cases 2 to 4 and decorative elements 5 may all be made of a rigid or semi-rigid material, for example in the form of parts of moulded or injection moulded plastic material, in the case of an inexpensive watch. They could have a rectangular or other shape, as a function of the desired aesthetic effect, and identical or different sizes. It will be noted that the invention allows all the fragile components of the watch to be grouped under cases 2 to 4 and thus protected against shocks, pressure or any external influence liable to damage them. Flexible film 10 is not entirely protected by the cases, but the embedding thereof in the elastomeric material of wristband 1 provides it with sufficient protection between the cases. It will also be noted that case 2 containing battery 15 may easily be dismantled to allow the battery to be replaced.

With the structure described hereinbefore, the wristwatch may be manufactured via an inexpensive method. Preferably, flexible integrated circuit film 10 is obtained by cutting a strip including a large number of these circuits. The watch movement components are mounted on the film, either before, or after the strip is cut. Next, the elastomeric body of wristband 1 is overmoulded onto film 10 provided with the electric components, protecting connection tongue 18 and contact strips 16 and 17 so that they emerge from the elastomeric body. If required, the overmoulding may be performed in several steps, in particular to facilitate positioning of the flexible film in the mould and/or incorporation of the reinforcing elements such as wires or a textile band forming a core of the wristband. The moulded body may include protruding elements to hold to display unit and the battery, for example by snap fitting. Display unit 20 may be connected to tongue 18, either prior to overmoulding, or afterwards. Then, one need only set battery 15 in place in cavity 14 and assemble cases 2 to 4 and decorative elements 5 on the wristband, and also assemble the clasp on the wristband if there is one. It is clear that this manufacturing mode allows the wristwatch to be produced as far as possible in an automated manner and at a very low cost.

Within the scope of the present invention, the construction described above may be subject to multiple variants. The display unit can be of any type, in particular the analogue type with a stepping motor. The battery acting as electric power source may be replaced by any other suitable power supply system, for example solar cells or a microgenerator driven by the movements of the person wearing the watch. The cases protecting the watch movement components, the display and the battery may be smaller or larger in number. In particular, several displays may be distributed in several cases, if the watch includes various additional functions. Several control buttons may also be provided, and they may be disposed either on the cases, or in the body of the wristband itself, for example by being embedded in the elastomer. Of course, decorative elements 5 are not indispensable within the scope of the invention.

What is claimed is:

1. An electronic wristwatch including:
   a flexible wristband having a body made of moulded elastomer;
   an electronic watch movement including components mounted on a flexible printed circuit film, said components and said flexible film being incorporated in said body of the wristband by overmoulding of the elastomer of said body;
   a display unit controlled by the watch movement; and
   an electric power source connected to the watch movement; said wristwatch further including a plurality of external elements mounted on said body of the wristband and connected to each other in a flexible way by the wristband, at least certain of said external elements being cases arranged so as to cover and protect watch movement components and said display unit.

2. A wristwatch according to claim 1, wherein said electric power source includes an electric battery and wherein one of said external elements is a case arranged to cover said battery.

3. A wristwatch according to claim 1, wherein said cases are applied in a sealed manner against said body of the wristband, wherein the elastomeric material of the wristband forms a sealing gasket.

4. A wristwatch according to claim 3, wherein said body of the wristband includes, facing each case, a superficial rim arranged to be applied in a sealed manner against the case.

5. A wristwatch according to claim 3, wherein each case is arranged to overlap said body of the wristband and is secured to the wristband by being gripped via a bottom plate disposed underneath said body.

6. A wristwatch according to claim 1, wherein certain of said external elements, apart from said cases, are decorative elements distributed along said body of the wristband and connected to each other in a flexible way by the wristband.

7. A wristwatch according to claim 6, wherein each decorative element is arranged to overlap the body of the wristband and is secured to the wristwatch by being gripped via a bottom plate disposed underneath said body.

8. A wristwatch according to claim 1, wherein the flexible printed circuit film includes a connection tongue provided with conductive paths that emerge outside the body of the wristband and connect to the display unit.

9. A wristwatch according to claim 1, wherein the flexible printed circuit film includes two contact strips that emerge outside the body of the wristband and connect to the power source.

10. A method for manufacturing a wristwatch according to claim 1, including successive steps wherein:
   mounting said watch movement components on said flexible printed circuit film, which includes electric connection means for connecting said flexible printed circuit film to said display unit and said power source;
   making said body of the wristband by overmoulding on said flexible printed circuit film and said components, with the exception of said electric connection means;
   connecting said display unit and said power source to said connection means and fixing said external elements to said body of the wristband.

11. An electronic wristwatch including:
   a flexible wristband having a body made of moulded elastomer;
   an electronic watch movement including components mounted on a flexible printed circuit film, said body being moulded over said components and said printed circuit film;
   a display unit electrically connected to said printed circuit film and controlled by the watch movement; and
   an electric power source connected to the watch movement; said wristwatch further including a plurality of cases mounted on said body of the wristband and arranged so as to cover and protect watch movement components and said display unit, said cases being applied in a sealed manner against said body of the wristband, wherein the elastomeric material of the wristband forms a sealing gasket for each case.

12. A wristwatch according to claim 11, wherein said electric power source includes an electric battery and wherein one of said cases is arranged to cover said battery.

13. A wristwatch according to claim 11, wherein said body of the wristband includes, facing each case, a superficial rim arranged to be applied in a sealed manner against the case.

14. A wristwatch according to claim 11, wherein each case is arranged to overlap said body of the wristband and is secured to the wristband by being gripped via a bottom plate disposed underneath said body.

15. A wristwatch according to claim 11, further including decorative elements distributed along said body of the wristband and connected to each other in a flexible way by the wristband.

16. A wristband according to claim 11, wherein the printed circuit film includes a connection tongue provided with conductive paths emerging outside the body of the wristband and connected to the display unit.

17. A wristwatch according to claim 11, wherein the flexible printed circuit film includes two contact strips emerging outside the body of the wristband and connected to the power source.

18. A method for manufacturing an electronic wristwatch, the electronic wristwatch including:
   a flexible wristband having a body made of moulded elastomer, wherein the body contains a flexible printed circuit film;
   an electronic watch movement including components mounted on said flexible printed circuit film, said body being moulded over said components and said printed circuit film;
   a display unit electrically connected to said printed circuit film and controlled by the watch movement; and
   an electric power source connected to the watch movement; said wristwatch further including a plurality of cases mounted on said body of the wristband and arranged to cover and to protect watch movement components and said display unit, said cases being applied in a sealed manner against said body of the wristband, the elastomeric material forming a sealing gasket for each case, wherein the method includes the steps of:
   (a) mounting said watch components on said printed circuit film, said printed circuit film including electric connection means for connecting to said display unit and said power source;
   (b) making said body of the wristband by overmoulding on said flexible printed circuit film and said components so that said electric connection means emerges from said body;
   (c) connecting said display unit and said power source to said connection means; and
   (d) fixing said external elements to said body of the wristband.

* * * * *